United States Patent [19]

Kiga

[11] Patent Number: 5,306,174
[45] Date of Patent: Apr. 26, 1994

[54] CONNECTING DEVICE FOR EASY CONNECTION OF SEPARATE CASINGS FOR ELECTRIC APPARATUS

[75] Inventor: Kazuyoshi Kiga, Kanagawa, Japan

[73] Assignee: Sony Corporation, Japan

[21] Appl. No.: 978,416

[22] Filed: Nov. 18, 1992

[30] Foreign Application Priority Data

Nov. 18, 1991 [JP] Japan .................. 3-301917

[51] Int. Cl.⁵ .............................................. H01R 4/50
[52] U.S. Cl. ...................................... 439/341; 439/376
[58] Field of Search ............... 439/310, 341, 347, 374, 439/376, 378; 403/405.1, 409.1

[56] References Cited

U.S. PATENT DOCUMENTS

| 3,728,664 | 4/1973 | Hurst ..................... 439/341 |
| 4,718,858 | 1/1988 | Godfrey et al. ............. 439/376 X |
| 4,840,574 | 6/1989 | Mills ..................... 439/372 X |
| 5,148,353 | 9/1992 | Morgan et al. ............. 439/341 X |
| 5,192,222 | 3/1993 | Krause et al. ............. 439/347 |

FOREIGN PATENT DOCUMENTS

639907 3/1983 Japan .
2138221 10/1984 United Kingdom ............... 439/347

Primary Examiner—Larry I. Schwartz
Assistant Examiner—Khiem Nguyen
Attorney, Agent, or Firm—Ronald P. Kananen

[57] ABSTRACT

A connecting device for detachably connecting two separate casings, includes a first movable engaging member slidable on a first casing, a second stationary engaging member secured to the second casing, and a link assembly operatively connected to the first engaging member. An actuator handle is operatively connected to the link assembly. A stopper is provided for locking a movement of the actuator handle. When the actuator handle is operated in one direction, the first engaging member is moved through the link assembly toward the second engaging member so as to be engaged with the second engaging member. When the actuator handle is operated in the other direction, the first engaging member is moved through the link assembly remote from the second engaging member so as to be disengaged from the second engaging member.

20 Claims, 7 Drawing Sheets

CONNECTING DEVICE FOR EASY CONNECTION OF SEPARATE CASINGS FOR ELECTRIC APPARATUS

BACKGROUND OF THE INVENTION

The present invention relates to a connecting device for detachably connecting two separate casings for electric apparatus such as those for a portable video camera and an adapter therefor.

Many portable video cameras, for instance, used in broadcasting fields are detachably connected with adapters therefor. For the connection of the video camera and the adapter, a connecting device is provided. Japanese Utility Model Application Second Publication No. 63-9907 discloses an example of such a connecting device for detachably connecting the video camera with an adapter. The connecting device includes a strike plate secured to the video camera and a latch secured to the adapter. The latch is formed with a wedge which is engaged with a dove-tail groove formed on the strike plate. With the connecting device, the video camera and the adapter are electrically interconnected to each other through connectors which are provided on the video camera and the adapter, respectively.

However, since the connecting device has no locking means, the adapter may be readily removed from the video camera due to rough use or under severe environmental conditions such as war, disaster areas. In order to solve the problem, there has been proposed a connecting device including a fastening member, for example, screws, which acts as a locking means. The fastening member is however handled only with particular tools, resulting in troublesome connecting and disconnecting operations of the video camera and adapter.

There is a great demand for a connecting device capable of easy and stable connection/disconnection of an apparatus with another apparatus.

SUMMARY OF THE INVENTION

A principal object of the present invention is to provide a connecting device which is adapted for readily and stable connecting and disconnecting an apparatus from another one.

The present invention provides a connecting device for detachably connecting a first casing with a second casing, comprising:
- first and second wedges disposed on the first casing;
- a third wedge secured to the second casing;
- a fourth wedge slidably mounted on the second casing;
- at least the second and fourth wedges are in substantially parallel with each other when the first and second casings are in their mating positions;
- means for driving the fourth wedge on the second casing; and
- means for locking the fourth wedge at a locking position where the fourth wedge is engaged with the second wedge of the first casing.

DESCRIPTION OF THE PREFERRED EMBODIMENT

Figure 1:
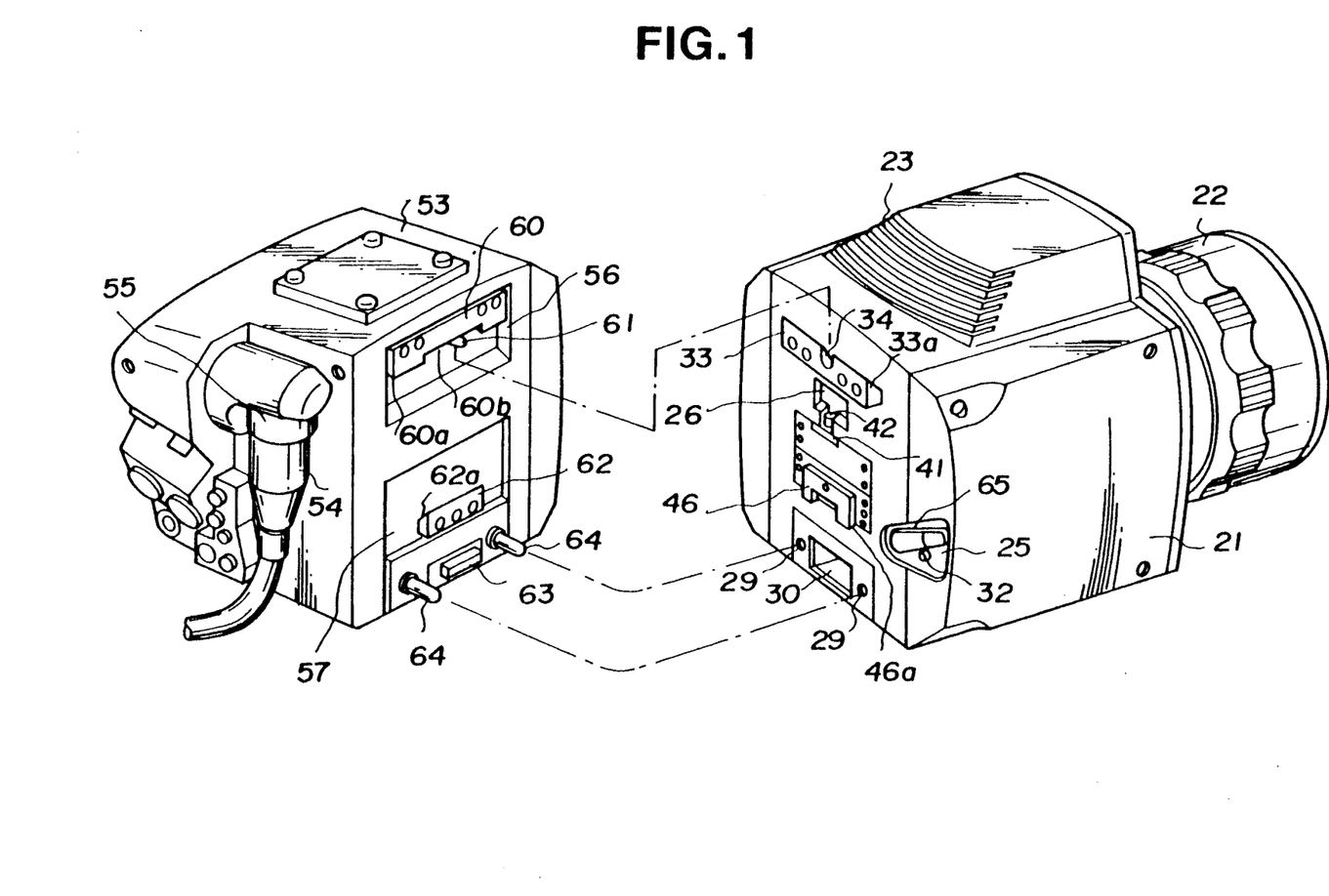
FIG. 1 is a perspective view of a video camera and an adapter therefor into which a preferred embodiment of a connecting device according to the present invention is incorporated.

Referring now to FIGS. 1 to 7, there is shown one preferred embodiment of a connecting device according to the present invention. The connecting device is adapted for detachably connecting a video camera with an adapter therefor. As shown in FIG. 1, the video camera includes a box-like casing 21 accommodating charge coupled devices and so on (not shown) therein. The adapter includes a box-like casing 53 which has a socket 55 connected with a signal input/output plug 54 on a left side wall thereof, as viewed in FIG. 2. The casing 21 has a knob-like top wall formed with a grille 23 and a front wall on which an image pick-up lens 22 is mounted. A rear wall of the casing 21 has an upper wedge 33 fixed on an upper portion thereof.

Figure 2:
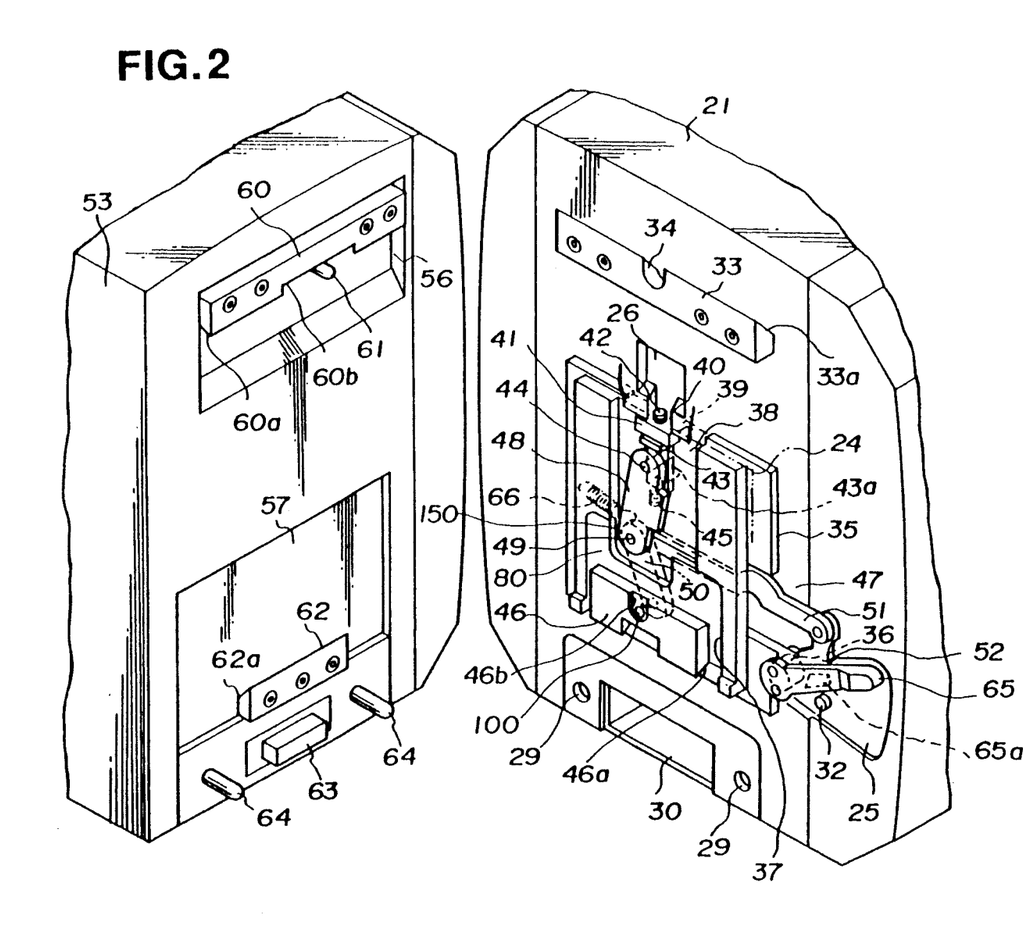
FIG. 2 is an enlarged perspective view of the connecting device.

As best shown in FIG. 2, the upper wedge 33 extends laterally on the rear wall and has a slanting top face 33a with a rearwardly ascending slope. A U-shaped groove 34 is formed in a substantially middle of an upper portion of the upper wedge 33. The slanting top face 33a is engaged with a slanting bottom face 60a of an upper wedge 60 which is secured to a front wall of the casing 53 of the adapter. The slanting bottom face 60a has a forwardly descending slope.

The upper wedge 60 is disposed in a rectangular upper recess 56 and extends laterally therealong, as seen in FIG. 2. A notch 60b is formed on a lower middle portion of the upper wedge 60. Disposed projectingly in the notch 60b is a pin 61 which is secured in the recess 56 of the front wall of the casing 53. The pin 61 is detachably fitted to the groove 34 of the wedge 33 on the casing 21 of the video camera.

As shown in FIG. 2, a connector 63 is secured at a lower end of the front wall of the casing 53 of the adapter. The connector 63 is detachably fitted into a recessed socket 30 which is formed at a lower end of the rear wall of the casing 21 of the video camera. On right and left sides of the connector 63 as viewed in FIG. 2, are disposed a pair of pins 64. The pins 64 are inserted into corresponding holes 29 which are formed on both sides of the recessed socket 30 on the rear wall of the casing 21.

As seen in FIG. 2, a rectangular lower recess 57 is formed upwardly remote from the connector 63 on the front wall of the casing 53 of the adapter. Secured in the recess 57 is a lower wedge 62 which extends in substantially parallel relation to the upper wedge 60. The lower wedge 62 has a slanting top face 62a with a forwardly ascending slope.

Figure 3:
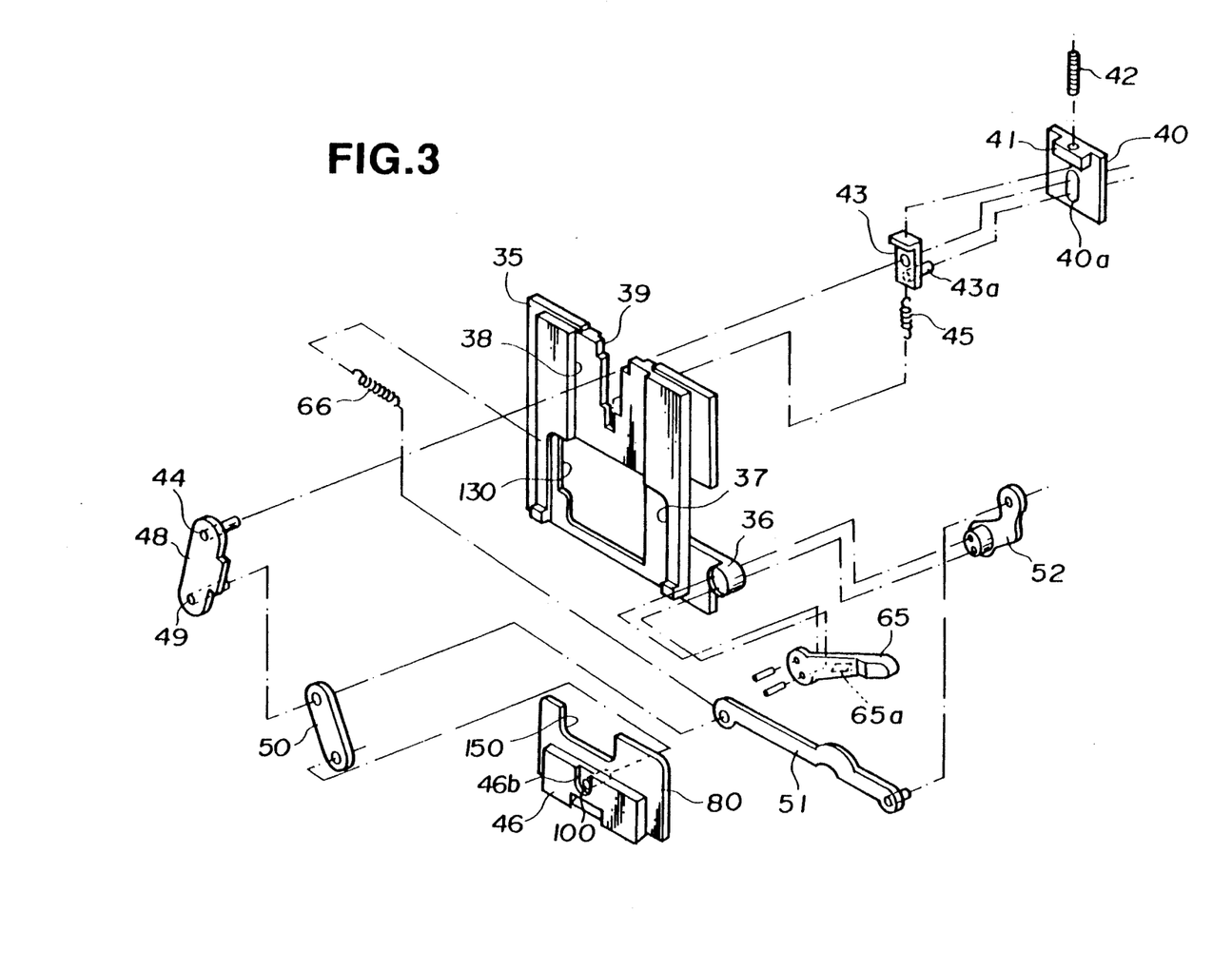
FIG. 3 is an exploded view of a main portion of the connecting device.
Figure 6:
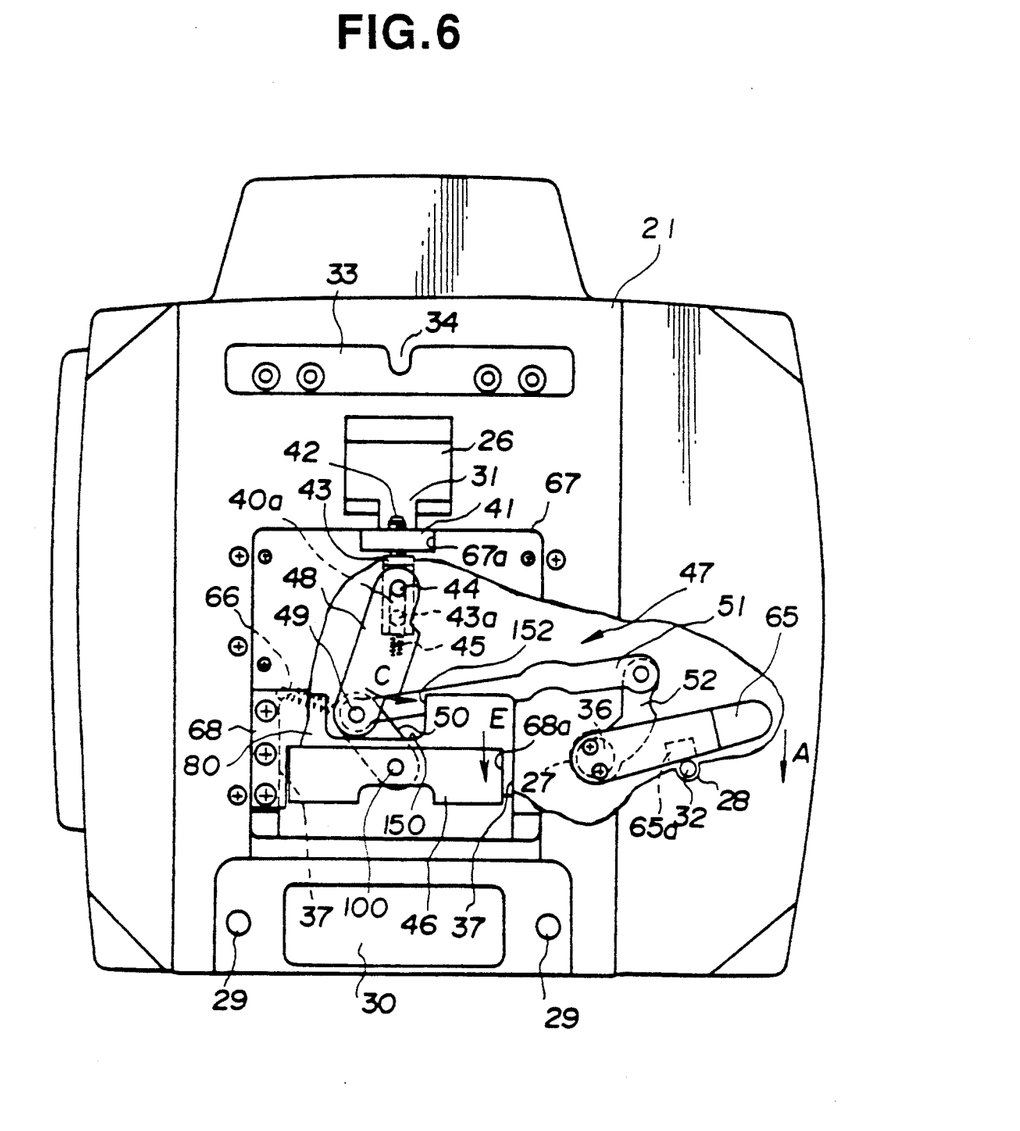
FIG. 6 is a rear elevation, partially broken away, of the video camera, in which the connecting device is in the disconnecting condition.
Figure 7:
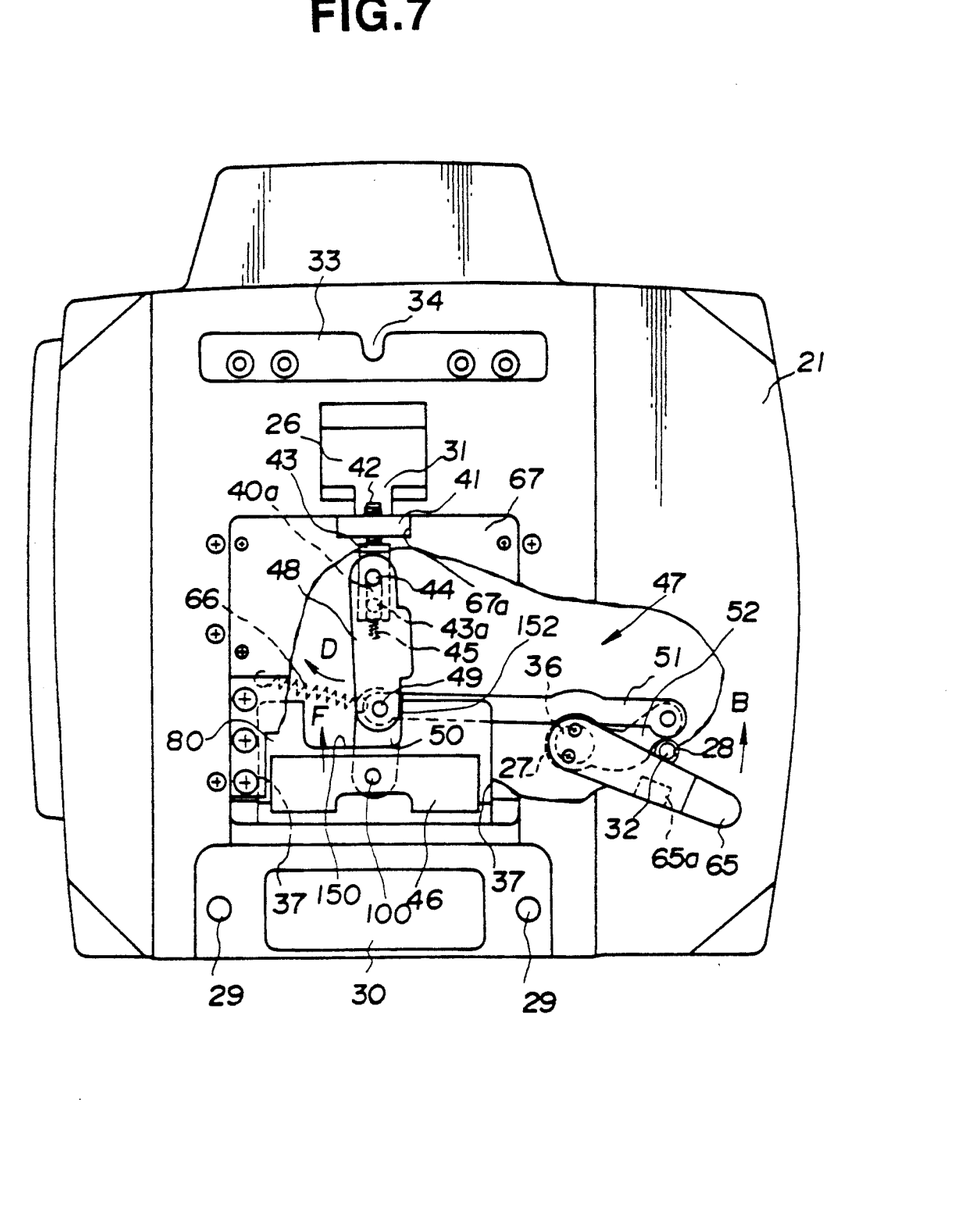
FIG. 7 is a rear elevation, partially broken away, of the casing of the video camera, in which the connecting device is in the connecting condition.

The rear wall of the casing 21 of the video camera has at the central portion thereof a rectangular opening 24 as indicated by a two-dot chain line in FIG. 2. The rectangular opening 24 communicates to a rectangular upper recess 26 through a groove 31 which is formed vertically on the rear wall as shown in FIGS. 6 and 7. A support plate 35 is fitted into the rectangular opening 24 from a front face of the rear wall so as to cover a substantially whole area of the rectangular opening 24. The support plate 35 is formed with lower and upper grooves 37 and 38 and a substantially rectangular center aperture 130 formed in the lower groove 37 as seen in FIG. 3. The lower groove 37 has a lateral width larger than that of the upper groove 38.

Fitted into the lower groove 37 is a substantially rectangular sliding plate 80 as seen in FIG. 2. The sliding plate 80 has a notch 150 on an upper portion thereof and a wedge 46 on a rear face thereof downwardly remote from the notch 150, as shown in FIG. 3. The wedge 46 has a slanting bottom face 46a with a rearwardly descending slope. The slanting bottom face 46a is releasably engaged with the slanting top face 62a of the lower wedge 62 on the casing 53 of the adapter.

Formed on the upper groove 38 of the support plate 35 is a T-shaped notch 39 which extends downwardly from a center top end thereof as best seen in FIG. 3. A screw holder base plate 40 is fitted to the notch 39 from the front side of the support plate 35 while an L-shaped pin mount 43 is fitted to the rear side of the notch 39. The screw holder base plate 40 is integrally formed with a screw holder 41 which projects rearwardly from an upper end thereof so as to have an "L" shape in section. An adjusting screw 42 is screwed through the screw holder 41 such that a lower end thereof contacts a top face of a rearwardly projecting portion of the L-shaped pin mount 43 as seen in FIG. 2. A top end of the adjusting screw 42 extends into the recess 26 of the rear wall of the casing 21.

As seen in FIG. 3, the L-shaped pin mount 43 has a lower end connected with a compression coil spring 45 which is secured to a bottom end of the notch 39. The compression coil spring 45 always urges the pin mount 43 upwardly against the adjusting screw 42. A vertical positioning of the pin mount 43 in the notch 39 is performed by adjusting a vertical dislocation of the adjusting screw 42. As shown in FIG. 3, the pin mount 43 has a pin 43a extending forwardly through an oval guide hole 40a which is formed on the screw holder base plate 40.

Inserted through the pin mount 43 into the guide hole 40a is a pin 44 which is secured to one end of a first link arm 48 as shown in FIG. 3. The first link arm 48 extends into the lower groove 37 of the support plate 35 as seen in FIG. 2 in such a manner that the other lower end of the first link arm 48 is located in the notch 150 of the sliding plate 80 but not interfered therewith when the sliding plate 80 is moved to its upper most position. The first link arm 48 is rotatably supported on the pin mount 43. The other lower end of the first link arm 48 is connected, through a pin 49 secured thereon, to one end of a second link arm 50. The other end of the second link arm 50 is connected to a front face of the sliding plate 80 by a pin 100 which projects forwardly from a recess 46b formed on a front side of the wedge 46.

A third link arm 51 extends laterally along the inside face of the rear wall and connected, at one end thereof, the pin 49 on the front side of the second link arm 50 so that the pin 49 serves as both a junction point and rotation axis of the first, second and third link arms 48, 50 and 51. The one end of the third link arm 51 is also connected to one end of a return spring 66 the other end of which is secured to the support plate 35, as viewed in FIG. 3. The return spring 66 serves to urge the junction point leftwardly as viewed in the drawings. The other end of the third link arm 51 is connected through a pin with one end of a fourth link arm 52. The other end of the fourth link arm 52 has, at the other end thereof, a rearwardly projecting boss which is rotatably inserted into a ring bearing 36 of the support plate 35. The ring bearing 36 projects outwardly from a right side of the support plate 35 and rearwardly from a rear face of the support plate 35 as viewed in FIG. 3. The ring bearing 36 is fitted into a hole 27 which is formed through the rear wall of the casing 21 as indicated in a two-dot chain line in FIGS. 6 and 7. The hole 27 is communicated with a triangular recess 25 formed on a rear face of the rear wall and located on the right side of the rectangular opening 24 as viewed in FIG. 2. These link arms 48, 50, 51 and 52 constitute a link assembly 47 which is operatively coupled with the wedge 46.

As best shown in FIG. 3, an actuator handle 65 is secured to the boss of the fourth link arm 52 so as to be rotatable in the ring bearing 36 together with the fourth link arm 52. The actuator handle 65 is formed 7ith a cam groove 65a on a front face thereof. The cam groove 65a is designed to receive a stopper 32 which is mounted into a small bore 28 formed in the recess 25 of the rear wall. The stopper 32 is always urged outwardly by a biassing means (not shown) so as to project from the small bore 28, as seen in FIGS. 6 and 7.

As seen in FIGS. 6 and 7, an upper cover plate 67 is secured to the support plate 35 so as to cover the whole upper groove 38 on the support plate 35. The upper cover plate 67 is formed with a notch 67a to which a rear end of the screw holder 41 is fitted. A lower cover plate 68 is secured to the support plate 35 so as to cover a part of the sliding plate 80. The lower cover plate 68 is formed with a notch 68a so as not to prevent a movement of the wedge 46 fixed on the sliding plate 80. As a result, the sliding plate 80 with the wedge 46 is slidable upwardly and downwardly along left and right side edges of the lower groove 37 without interfering with the lower cover plate 68, as viewed in FIG. 2.

Figure 4:
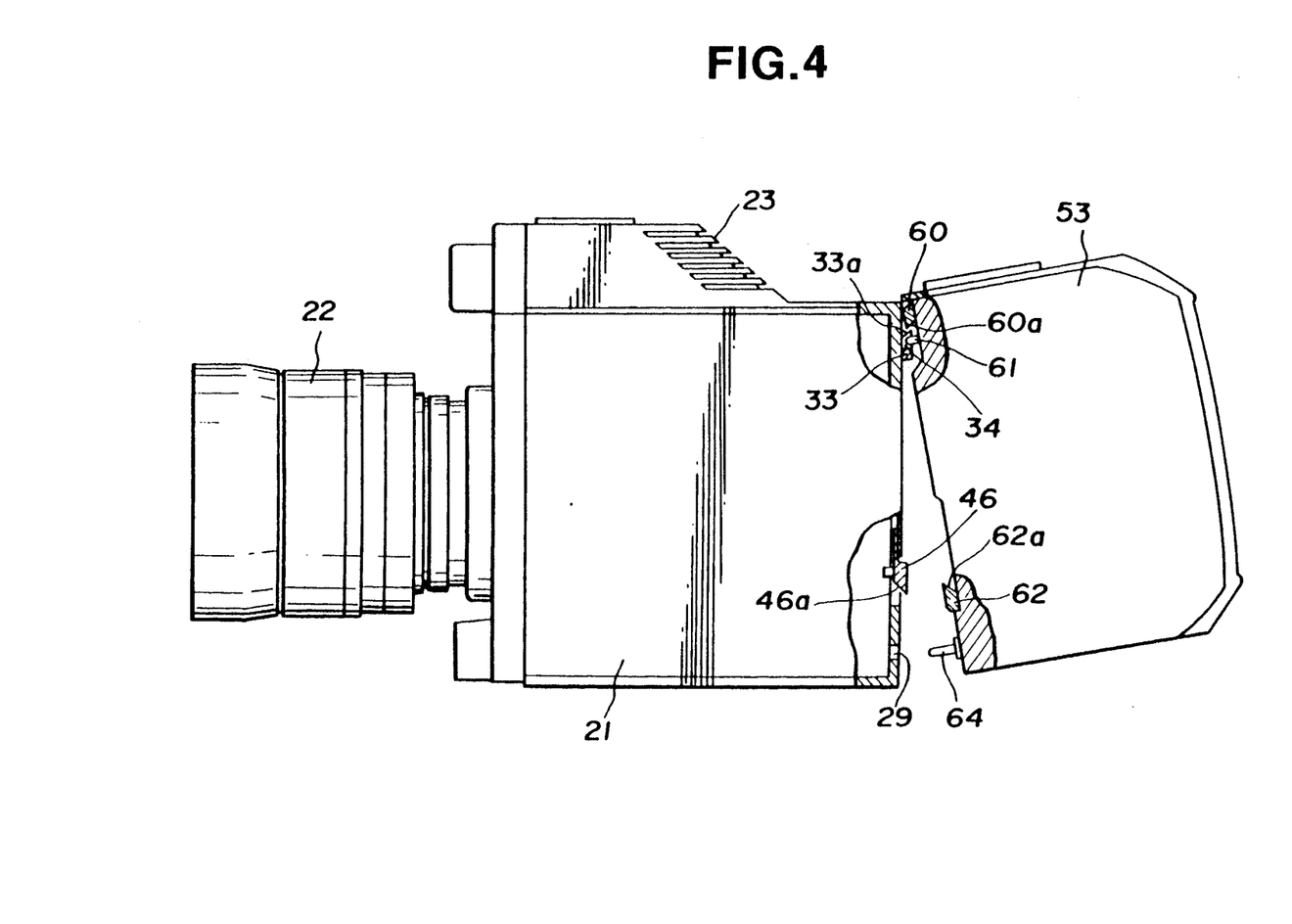
FIG. 4 is a side elevation, partially broken away, of the video camera and the adapter, showing an initial state of a connecting operation of the video camera with the adapter.
Figure 5:
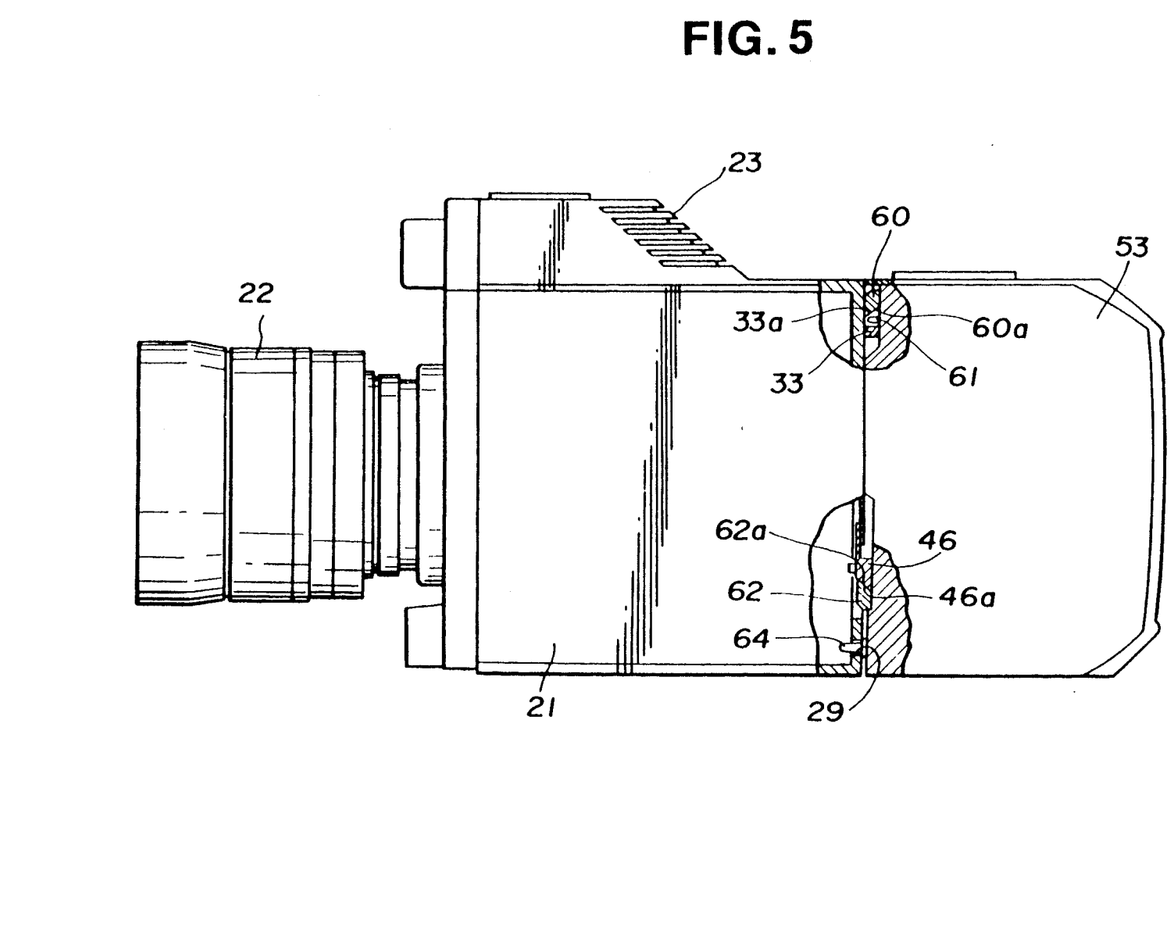
FIG. 5 is a side elevation, partially broken away, of the video camera and the adapter, showing such a condition that the connecting operation is completed.

The connecting operation of the video camera with the adapter is performed as follows. First, upper portions of the two casings 21 and 53 are opposed to each other such that the pin 61 is inserted into the groove 34 as seen in FIG. 4. Subsequently, lower portions of the casings 21 and 53 are opposed to each other such that the pins 64 are inserted into the holes 29 as shown in FIG. 5. It should be noted from the drawings that a free end of the actuator handle 65 and the stopper 32 are accessible to an operator when the casings 21 and 53 are brought into face contact with each other. Then, the actuator handle 65 is actuated to rotate in the ring bearing 36 in a clockwise direction as indicated at an arrow "A" in FIG. 6. A further clockwise rotation of the actuator handle 65 causes the stopper 32 to be depressed into the bore 28 against an outwardly biassing force of the spring. When the actuator handle 65 is located in a position as shown in FIG. 7, the actuator handle 65 is locked in the position because the stopper 32 again projects from the bore 28 whereby a counterclockwise rotation of the actuator handle 65 is prevented. The clockwise rotation of the actuator handle 65 causes the fourth link arm 52 to rotate about the ring bearing 36 in the clockwise direction. And then, the third link arm 51 and therefore the junction pin 49 for the first to third link arms are allowed to move rightwardly as viewed in FIG. 6, against a leftwardly biassing force of the return spring 66. The rightward movement of the third link arm 51 causes the first link arm 48 to rotate about the pin 44 in a counterclockwise direction as indicated at an arrow "C" in FIG. 6. The counterclockwise rotation of the first link arm 48 allows the second link arm 50 to rotate about the pin 100 on the sliding plate 80 in the clockwise direction. Accordingly, the sliding plate 80 connected to the second link arm 50 moves downwardly as indicated at an arrow "E" in FIG. 6. Namely, the wedge 46 secured on the sliding plate 80 moves downwardly from its first position to advance close to the lower wedge 62 of the casing 53 of the adapter. The wedge 46 is located in a second position, namely its lowest position, whereupon the first link arm 48 is aligned vertically with the second link arm 50. In this state, the slanting bottom face 46a of the wedge 46 completely engages the slanting top face 62a of the lower wedge 62. The rotation of the first link arm 48 further continues until the first link arm 48 contacts a right side edge 152 of the notch 150 of the sliding plate 80, whereupon the first and second link arms 48 and 50 are out of vertical alignment as seen in FIG. 7. At this time, the sliding plate 80 moves back slightly upwardly so that the wedge 46 is located in a third position slightly above the second position. In this third position, the wedge 46 is still sufficiently engaged with the corresponding lower wedge 62. When located in the third position, the wedge 46 is locked due to locking of the actuator handle 65 and therefore the link assembly 47 as described hereinbefore. It is advantageous to lock the wedge 46 in the third position because the junction pin 49 of the first and second link arms 48 and 50 is subject to further rightward force when the wedge 46 tends to move upwardly due to an upward reaction force from the lower wedge 62 engaged therewith. This prevents the first and second link arms 48 and 50 from moving back leftwardly. Furthermore, when the wedge 46 is moved from the second position to the third position, a so-called click feeling is provided due to reverse of the direction of a force exerted to the junction pin 49 of the first and second link arms 48 and 50.

The disconnecting operation of the video camera from the adapter is performed in reverse sequence of the connecting operation. When the actuator handle 65 is maintained in the locked position as seen in FIG. 7, the stopper 32 is manually depressed by the operator. The actuator handle 65 is rotated about the ring bearing 36 in a counterclockwise direction as indicated at an arrow "B" in FIG. 7 until the actuator handle 65 is located in the unlocked position as shown in FIG. 6. The counterclockwise rotation of the actuator handle 65 causes the fourth link arm 52 to also rotate about the ring bearing 36 in the counterclockwise direction. Then, the third link arm 51 is urged leftwardly as viewed in FIG. 7. Accordingly, the first link arm 48 rotates about the pin 44 in a clockwise direction as indicated at an arrow "D" in FIG. 7. The clockwise rotation of the first link arm 48 causes the second link arm 50 to rotate about the pin 100 on the sliding plate 80 in the counterclockwise direction. The sliding plate 80 connected to the second link arm 50 moves upwardly as indicated at an arrow "F" in FIG. 7. Therefore, the wedge 46 on the sliding plate 80 is disengaged from the corresponding lower wedge 62. Subsequently, the two casings are disconnected in such a manner that the pins 64 are removed from the holes 29 and then the pin 61 is removed from the groove 34.

As is appreciated from the above description, the connection/disconnection operation is readily performed by operation of engaging the wedge 46 on the sliding plate 80 with the corresponding wedge 62 by the link assembly 47. Further, the engagement of the wedges 46 and 62 is stably established by locking the actuator handle 65 by the stopper 32. Furthermore, in a case where loose engagement of the wedges 46 and 62 is caused for a relatively long period of use, the wedge 46 is allowed to certainly engage the corresponding wedge 62 by adjustment of the adjusting screw 42.

What is claimed is:

1. A connecting device for detachably connecting a first casing with a second casing, comprising:
   first and second wedges disposed on said first casing;
   a third wedge secured to said second casing;
   a fourth wedge slidably mounted on said second casing;
   at least said second and fourth wedges being substantially parallel with each other when said first and second casings are in a mating position;
   means for driving said fourth wedge on said second casing, said driving means comprising a link assembly which is operatively coupled with said fourth wedge; and
   means for locking said fourth wedge at a locking position where said fourth wedge is engaged with said second wedge of said first casing;
   wherein said link assembly comprises:
   a first link rotatably mounted on said second casing; and
   a second link connected, at one end thereof, with said first link and, at the other end thereof, with said fourth wedge;
   wherein, when said first and second casings mate with each other and said link assembly is operated in one direction, said fourth wedge moves from a first position where said fourth wedge is located remotest from said second wedge, through a second position where said fourth wedge is located closest to said second wedge to be engaged therewith, into a third position where said fourth wedge is located between said first and second positions but still engaged with said second wedge.

2. A connecting device as claimed in claim 1, wherein said first and third wedges serve as positioning means for placing said first and second casings in said mating position.

3. A connecting device as claimed in claim 1, 7herein the locking of said fourth wedge by said locking means is performed by restricting a movement of said link assembly in said one direction and another direction reverse thereto.

4. A connecting device as claimed in claim 1, wherein the movement of said link assembly in said one direction is limited by abutment thereof against a part of said second casing at said third position of said fourth wedge.

5. A connecting device as claimed in claim 4, further comprising an actuator handle for operating said link assembly.

6. A connecting device as claimed in claim 5, further comprising a stopper which locks a movement of said actuator handle.

7. A connecting device as claimed in claim 4, wherein said second casing includes a biassing means for biassing at least one of said first and second links in a direction whereupon said fourth wedge is urged toward said first position.

8. A connecting device as claimed in claim 1, wherein said first casing includes a wall having an upper portion on which said first wedge extends substantially horizontally, and a lower portion on which said second wedge extends substantially horizontally, said first wedge being formed with a slant lower face and said second wedge is formed with a corresponding slant upper second wedge is formed with a corresponding slant upper face, while said second casing includes a wall having an upper portion on which said third wedge extends substantially horizontally, and a lower portion on which said fourth wedge extends substantially horizontally, said third wedge being formed with a slant upper face which engages said slant lower face of said first wedge, said fourth wedge being formed with a slant lower face which engages said slant upper face of said second wedge.

9. A connecting device as claimed in claim 8, wherein said slant upper face of said third wedge has a notch for receiving a pin which is disposed below said first wedge on the wall of said first casing.

10. A connecting device as claimed in claim 9, wherein said wall of said first casing has a first connector at a lower end thereof and said wall of said second casing has at a lower end thereof a second connector which engage said first connector, said engagement of said first and second connectors causing said first and second casings to be electrically interconnected.

11. A connecting device as claimed in claim 1, wherein said first casing is a camera adapter and said second casing is a camera.

12. A connecting device mounted on a second casing and including a link assembly for connecting said second casing with a first casing, said first casing having first and second wedges, comprising:
   a third wedge secured to said second casing;
   a fourth wedge slidably disposed on said second casing;
   at least said second and fourth wedges being substantially parallel with each other when said first and second casings are in a mating position;
   means for driving said fourth wedge on said second casing; and
   means for locking said fourth wedge at a locking position where said fourth wedge is engaged with said second wedge of said first casing;
   wherein said link assembly comprises:
      a first link rotatably mounted on said second casing; and
      a second link connected, at one end thereof, with said first link and, at the other end thereof, with said fourth wedge;
   wherein, when said first and second casings mate with each other and said link assembly is operated in one direction, said fourth wedge moves from a first position where said fourth wedge is located remotest from said second wedge, through a second position where said fourth wedge is located closest to said second wedge to be engaged therewith, into a third position where said fourth wedge is located between said first and second positions but still engaged with said second wedge.

13. A connecting device as claimed in claim 12, wherein the movement of said link assembly in said one direction is limited by abutment thereof against a part of said second casing at said third position of said fourth wedge.

14. A connecting device as claimed in claim 13, further comprising an actuator handle for operating said link assembly.

15. A connecting device as claimed in claim 14, further comprising a stopper which locks a movement of said handle.

16. A connecting device as claimed in claim 13, wherein said second casing includes a biassing means for biassing at least one of said first and second links in a direction whereupon said fourth wedge is urged toward said first position.

17. A connecting device as claimed in claim 12, wherein said first casing includes a wall having an upper portion on which said first wedge extends substantially horizontally, and a lower portion on which said second wedge extends substantially horizontally, said first wedge being formed with a slant lower face and said second wedge is formed with a corresponding slant upper face, while said second casing includes a wall having an upper portion on which said third wedge extends substantially horizontally, and a lower portion on which said fourth wedge extends substantially horizontally, said third wedge being formed with a slant upper face which engages said slant lower face of said first wedge, said fourth wedge being formed with a slant lower face which engages said slant upper face of said second wedge.

18. A connecting device as claimed in claim 17, wherein said slant upper face of said third wedge has a notch for receiving a pin which is disposed below said first wedge on the wall of said first casing.

19. A connecting device as claimed in claim 18, wherein said wall of said first casing has a first connector at a lower end thereof and said wall of said second casing has at a lower end thereof a second connector which engage said first connector, said engagement of said first and second connectors causing said first and second casings to be electrically interconnected.

20. A connecting device as claimed in claim 12, wherein said first casing is a camera adapter and said second casing is a camera.

* * * * *